(12) United States Patent
Posseme et al.

(10) Patent No.: US 12,477,785 B2
(45) Date of Patent: Nov. 18, 2025

(54) QUANTUM DEVICE AND METHOD FOR PRODUCING THE SAME

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Louis Hutin, Grenoble (FR); Cyrille Le Royer, Grenoble (FR); François Lefloch, Grenoble (FR); Fabrice Nemouchi, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 574 days.

(21) Appl. No.: 17/456,400

(22) Filed: Nov. 24, 2021

(65) Prior Publication Data

US 2022/0173229 A1 Jun. 2, 2022

(30) Foreign Application Priority Data

Nov. 27, 2020 (FR) .................................... 20 12307

(51) Int. Cl.
*H10D 48/00* (2025.01)
*H10D 64/60* (2025.01)
(Continued)

(52) U.S. Cl.
CPC ......... *H10D 48/383* (2025.01); *H10D 64/608* (2025.01); *H10N 60/0912* (2023.02); *H10N 60/128* (2023.02)

(58) Field of Classification Search
None
See application file for complete search history.

(56) References Cited

U.S. PATENT DOCUMENTS

| 5,416,072 A | 5/1995 | Inada et al. |
| 5,446,015 A | 8/1995 | Nakamura et al. |
| (Continued) | | |

FOREIGN PATENT DOCUMENTS

| EP | 0 484 253 A2 | 5/1992 |
| EP | 0 484 253 A3 | 5/1992 |
| (Continued) | | |

OTHER PUBLICATIONS

English Translation of WO-2013026243-A1.*
(Continued)

*Primary Examiner* — Yara B Green
*Assistant Examiner* — Fakeha Sehar
(74) *Attorney, Agent, or Firm* — Oblon, McClelland, Maier & Neustadt, L.L.P.

(57) ABSTRACT

A quantum device includes a transistor pattern carried by a substrate, the transistor pattern having, in a stack, a gate dielectric and a superconducting gate on the gate dielectric. The superconducting gate has a base, a tip, sidewalls and at least one superconducting region made of a material that has, as a main component, at least one superconducting element. The superconducting gate also includes a basal portion having a dimension, taken in a first direction of a basal plane that is smaller than a dimension of the tip of the superconducting gate. The transistor pattern further includes at least one dielectric portion made of a dielectric material in contact with the top face of the gate dielectric and the basal portion of the superconducting gate.

19 Claims, 8 Drawing Sheets

(51) Int. Cl.
*H10N 60/01* (2023.01)
*H10N 60/10* (2023.01)

(56) References Cited

U.S. PATENT DOCUMENTS

| | | | |
|---|---|---|---|
| 5,466,664 A | 11/1995 | Inada et al. | |
| 5,547,923 A | 8/1996 | Nakamura et al. | |
| 2005/0158935 A1* | 7/2005 | Shin | H01L 29/66553 |
| | | | 438/303 |
| 2020/0279937 A1 | 9/2020 | Pillarisetty et al. | |
| 2020/0287119 A1* | 9/2020 | Black | B82Y 10/00 |

FOREIGN PATENT DOCUMENTS

| | | | | |
|---|---|---|---|---|
| KR | 10-2012-0130359 A | 12/2012 | | |
| WO | WO-2013026243 A1 * | 2/2013 | ........ | H01L 21/28114 |

OTHER PUBLICATIONS

French Preliminary Search Report issued Sep. 30, 2021 in French Application 20 12307 filed on Nov. 27, 2020, 9 pages (with English Translation of Categories of Cited Documents & Written Opinion).

De Franceschi et al., "SOI technology for quantum information processing", 2016 IEEE International Electron Devices Meeting (IEDM), 2016, 4 pages.

* cited by examiner dimension $L_{210}$ of the top face of the gate dielectric, taken
QUANTUM DEVICE AND METHOD FOR PRODUCING THE SAME

TECHNICAL FIELD

The present invention relates to the field of quantum electronics. One particularly advantageous application is that of the production of superconducting gates in quantum bit devices (referred to as qubits), in particular for devices based on spin qubit or superconducting qubit architectures.

PRIOR ART

In the field of quantum electronics, a quantum bit or qubit is a quantum state that represents the smallest unit of quantum information storage. This quantum state is characterised by the quantum superposition of a plurality of states, in particular the state 0 and the state 1. In practice, the quantum bit can be obtained by different devices based on different architectures. There are thus qubits linked to a quantum state:
  of a charge carrier, for example the spin of an electron or of a hole (spin qubit),
  of a current flowing in a superconductor, for example its phase (superconducting qubit),
  of a trapped ion or of an atom or a molecule, for example its energy level,
  of a photon, for example its polarisation (photon qubit).

Each type of device has its own intrinsic advantages and drawbacks. For example, quantum devices with superconducting qubits allow good entanglement between qubits. However, these devices are still subject to too much variability. They are in particular sensitive to small imperfections resulting from the manufacturing methods. They in particular require a very high quality interface between the two superconducting reservoirs to achieve a Josephson effect. It is also difficult to form a unitary qubit using these devices.

Spin qubit quantum devices can operate with a smaller number of qubits, and consume less energy. They can also benefit from microelectronic manufacturing methods and technologies to improve reproducibility and increase the integration density of these spin qubit devices.

The document entitled "SOI technology for quantum information processing" by S. De Franceschi et al, Electron Devices Meeting (IEDM), 2016 IEEE International, pp. 13.4.1-13.4.4, describes a spin-qubit quantum device produced using a manufacturing method derived from fully depleted channel transistor (FDSOI) technologies. FIG. 1 shows some standard steps in the manufacture of such a device. One or more transistor patterns, each comprising a gate and a gate dielectric are formed 100 on an SOI substrate. Spacers are then formed 200 on either side of the gate patterns. The raised source/drain regions are formed 300 by epitaxy at the edge of the spacers. After removal 400 of the hard mask from the top of the gate, the gate is silicided 500. This method in particular allows for the production of a quantum device with two qubits in series, in an active region 11 of an SOI substrate 1, as shown in FIG. 2. The two gates 22a are used to control these two qubits. The source and drain regions 31 form charge carrier reservoirs for these two qubits. Nonetheless, such a spin qubit quantum device has a lower operating speed than a superconducting qubit device.

One purpose of the present invention is to overcome, at least in part, some of the aforementioned drawbacks.

In particular, the present invention aims to provide a quantum device that reduces energy consumption while improving operating speed.

The present invention further aims to provide a method for producing such a quantum device.

Other purposes, features and advantages of the present invention will appear upon reading the following description and the accompanying drawings. It is understood that other advantages can be incorporated therein. In particular, some of the features and advantages of the quantum device can be applied mutatis mutandis to the method, and vice-versa.

SUMMARY

In order to achieve this objective, according to one embodiment, a first aspect relates to a quantum device comprising a transistor pattern carried by a substrate, said transistor pattern comprising, in a stack:
  a gate dielectric on a front face of the substrate,
  a superconducting gate on a top face of the gate dielectric, said gate having a base in contact with the top face of the gate dielectric, a top opposite the base and sidewalls extending between the base and the top, said gate comprising at least one superconducting region made of a material that has, as a main component, at least one superconducting element.

Advantageously, the gate comprises a basal portion and a top portion, the basal portion extending from the base to the top portion and the top portion extending from the basal portion to the top, the basal portion having a first dimension $L_{22base}$, taken in a first direction x of a basal plane xy, that is smaller than a second dimension $L_{22top}$ of the top portion, taken in the first direction x, and that is smaller than a dimension $L_{210}$ of the top face of the gate dielectric, taken in the first direction x. The basal portion is thus recessed with respect to the top portion and to the gate dielectric in the first direction x, and this recess forms at least one cavity. The transistor pattern advantageously further comprises at least one dielectric portion made of a dielectric material in the at least one cavity.

Thus, the gate has a narrowed portion at its base—the basal portion—allowing a spacer—the dielectric portion—to be inserted beneath the top portion of the gate. When viewed via a cross-section, the basal portion can typically be trapezoidal in shape, with the smallest dimension facing the channel and/or in contact with the gate dielectric. The top portion thus typically overhangs the basal portion, above the dielectric portion. The top portion forms an overhang with respect to the basal portion in the x direction. The dielectric portion is located on the gate dielectric, beneath the top portion, and flanks the basal portion. This allows, for example, source and drain regions to be formed as close as possible to the transistor pattern. This improves electrostatic gate control. Thus, an electron spin qubit quantum device can in particular be produced. The superconducting gate of the transistor pattern advantageously allows a magnetic field compatible with the control of electron spin qubits to be generated and modulated.

A second aspect relates to a method for producing a quantum device according to the first aspect, comprising the following steps:
  Providing a substrate having a front face and carrying, in a stack on the front face thereof:
    A dielectric layer made of a dielectric material having a top face extending along a basal plane xy, at least one gate layer made of a gate material on the top face of the dielectric layer, said at least one gate layer having a thickness $e_{22}$ in a third direction z normal to the basal plane xy, Forming a hard mask on the at least one gate layer, the hard mask having gate patterns defining the planar dimensions of at least one gate, Partially anisotropically etching, in the third direction z and to a depth $d_p < e_{22}$ in said third direction z, the at least one gate layer, so as to form gate sidewalls at a top gate portion, Isotropically etching the at least one gate layer to a depth $d'_p = e_{22} - d_p$, so as to expose the top face of the dielectric layer and so as to form at least one cavity at a basal gate portion located beneath the hard mask, projected in the third direction z, said at least one cavity extending along a dimension $L_{230}$ in the first direction x, Filling the at least one cavity with a dielectric material so as to form at least one dielectric portion, Forming a metal layer that has, as a main component, at least one metal species, at least on the sidewalls at the top portion of the gate, said at least one metal species comprising at least one superconducting element, Forming a superconducting region in the gate by lateral diffusion of the at least one superconducting element from the sidewalls of said gate, so as to obtain the superconducting gate.

Existing methods generally implement a step of siliciding the gate from the top. This is not appropriate for spin control. In this case, it became apparent that good spin control required the formation of a superconducting region as close as possible to the channel, immediately above the gate dielectric. In contrast to prior art methods, the method allows such a superconducting region to be formed by lateral diffusion from the sidewalls of the gate.

This lateral diffusion is carried out from the metal layer comprising at least one superconducting element.

The method thus enables a quantum device with a superconducting gate transistor architecture to be produced.

This enables an electron spin qubit quantum device to be produced with an enhanced operating speed. The superconducting region formed by the method also reduces the energy consumption of the device during qubit operations.

A superconducting qubit quantum device can also be produced using the method. Such a device thus benefits from the advantages of implementing the method using technology of the microelectronics industry. In particular, the integration density of such a device can be increased.

The quantum device can be advantageously implemented in certain applications, for example without being limited thereto, transmon (superconducting charge qubit), gatemon (transmon with variable polarisation) or JoFET (FET—field effect transistor—with superconducting source and drain regions) applications.

BRIEF DESCRIPTION OF THE FIGURES

The aims, purposes, features and advantages of the invention will be better understood upon reading the detailed description given of one embodiment thereof, which is illustrated by means of the following accompanying drawings, in which.

Figure 1:
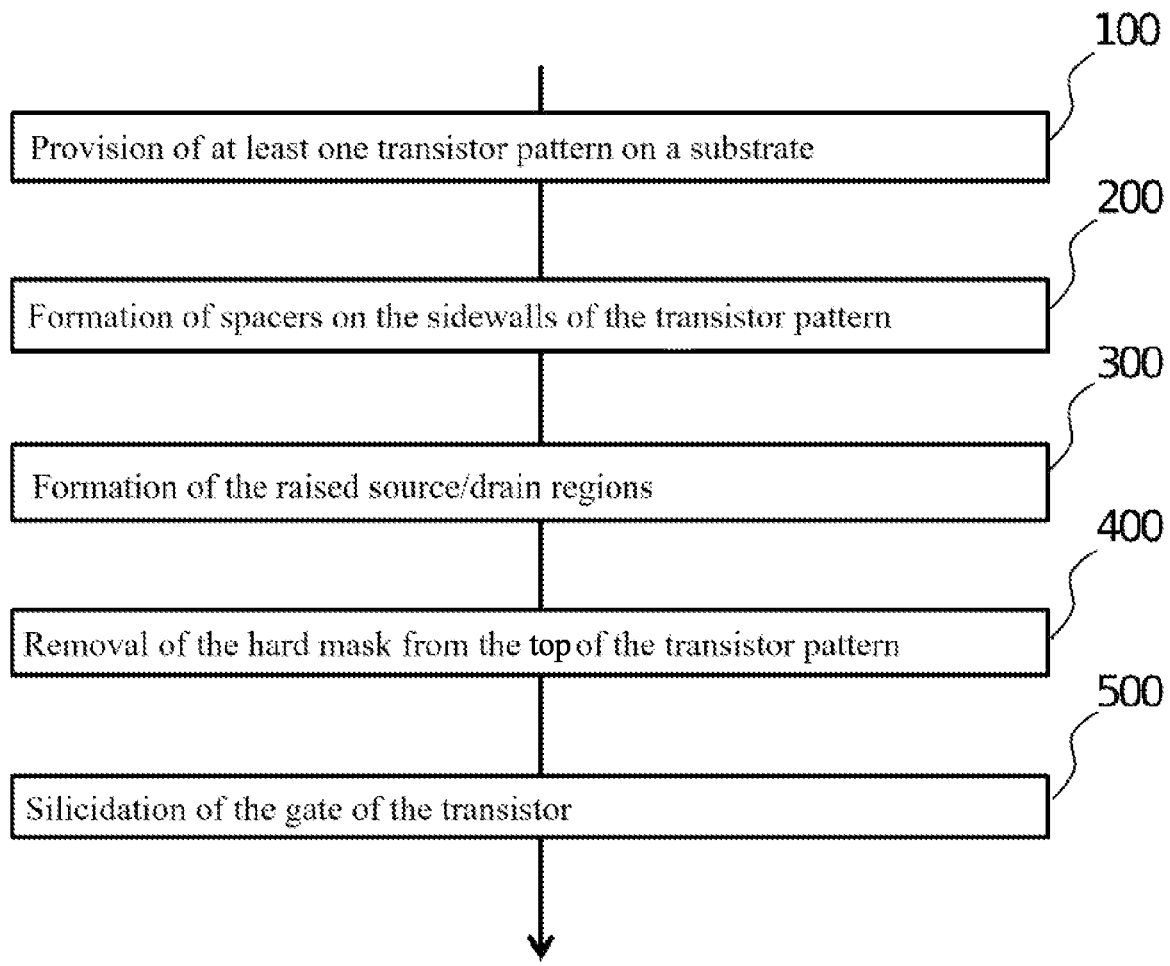
FIG. 1 shows a diagram illustrating the steps involved in producing a transistor according to a method of the prior art.
Figure 2:
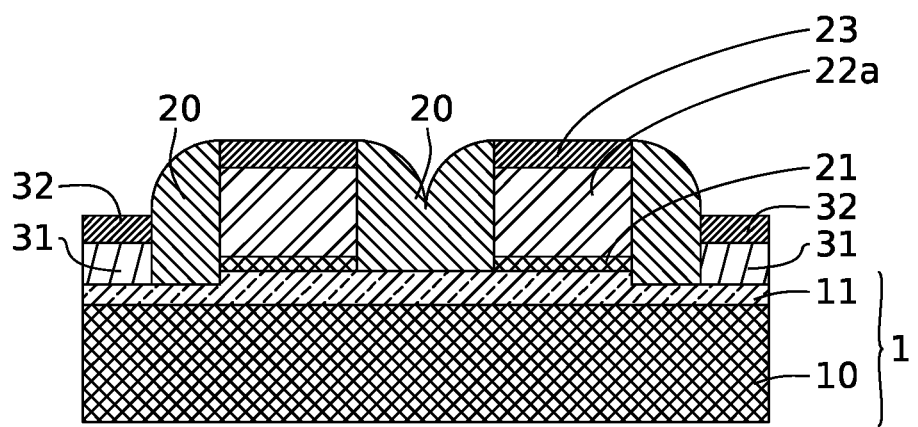
FIG. 2 diagrammatically shows a quantum device according to the prior art obtained from the production method shown in FIG. 1.

The drawings are provided by way of example and are not intended to limit the scope of the invention. They constitute diagrammatic views intended to ease the understanding of the invention and are not necessarily to the scale of practical applications. In particular, the relative dimensions of the different layers, portions and elements of the device (for example the dielectric portion or spacer, the active layer, the basal portion, the top portion, the source/drain region, the gate, or the hard mask) are not representative of reality.

DETAILED DESCRIPTION

Before giving a detailed description of the embodiments of the invention, it should be noted that the invention, according to the first aspect thereof, in particular comprises the optional features given hereinbelow, which can be used in combination with one another or separately:

According to one example, the first dimension $L_{22base}$ is a minimum dimension. According to one example, the second dimension $L_{22top}$ is a maximum dimension.

According to one example, the dimensions $L_{222}$ and $L_{210}$ of the top of the gate and of the top face of the gate dielectric are substantially equal to one another.

According to one example, the base has a dimension $L_{220}$, taken in the first direction x, that is equal to the minimum dimension $L_{22base}$ of the basal portion.

According to one example, the dimensions $L_{220}$, $L_{22base}$ are at least 20% smaller than the dimension $L_{22top}$.

According to one example, the dimensions $L_{220}$, $L_{22base}$ are at least 20% smaller than the dimension $L_{210}$.

According to one example, the maximum dimension $L_{22top}$ of the top portion and the dimension $L_{210}$ of the top face of the gate dielectric are substantially equal to one another.

According to one example, the top has a dimension $L_{222}$, taken in the first direction x, that is equal to the maximum dimension $L_{22top}$ of the top portion.

According to one example, the dimensions $L_{22top}$ and/or $L_{222}$ and/or $L_{210}$ are smaller than 20 nm.

According to one example, the dielectric portion is in contact with the top face of the gate dielectric and in contact with the basal portion of the gate.

According to one example, the sidewalls of the gate at the basal portion are inclined at an angle aα comprised between 30° and 60° to the basal plane xy.

According to one example, the at least one dielectric portion has at least one sidewall substantially in the continuation of at least one of the sidewalls of the top portion of the gate.

According to one example, the base of the gate is substantially centred relative to the top face of the gate dielectric in the first direction x.

According to one example, the basal portion has a height $h_{base}$ taken in a third direction z normal to the basal plane xy, and the dielectric portion has a height $h_{23}$ in the third direction z that is substantially equal to $h_{base}$. The height $h_{23}$ can be comprised between 1 nm and 10 nm, preferably between 2 nm and 5 nm.

According to one example, the quantum device further comprises source and drain regions comprising at least one superconducting region made of a material based on at least one superconducting element, for example PtSi, $Co_2Si$, $V_3Si$.

According to one example, the source and drain regions have an edge that is substantially vertical to at least one sidewall of the at least one dielectric portion.

According to one example, the transistor pattern has a symmetry along a plane yz.

According to one example, the transistor pattern further comprises a hard mask on top of the gate. In particular, the hard mask can be retained during the manufacture of the device to prevent diffusion of at least one metal species in the gate from said top, such that the formation of the superconducting region only occurs by lateral diffusion from the sidewalls of the gate. This results in a relatively planar diffusion front progressing from each of the sidewalls to a median plane in the centre of the gate. This improves the quality of the superconducting region thus formed.

The invention, according to the second aspect thereof, in particular comprises the following optional features which can be used in combination with one another or alternatively to one another:

According to one example, the hard mask is removed prior to the formation of the metal layer, said metal layer being formed on the sidewalls and the top of the gate, such that the formation of the superconducting region occurs by lateral diffusion from the sidewalls of the gate and by diffusion from the top of the gate.

According to one example, the gate material is polycrystalline silicon.

According to one example, the metal layer formed comprises at least one superconducting element chosen from cobalt, platinum and vanadium.

According to one example, the method comprises, after the formation of the at least one dielectric portion, a partial removal of the dielectric layer configured to expose part of the front face of the substrate and to retain a portion of said dielectric layer beneath the hard mask, projected in the third direction z, said portion forming the gate dielectric.

According to one example, the metal layer is formed on the exposed front face of the substrate, after partial removal of the dielectric layer, so as to form at least one superconducting region at source and drain regions of the substrate by diffusion. This allows superconducting source and drain regions to be formed in an active layer of the substrate, at the same time as the superconducting region is formed in the gate.

According to one example, lateral diffusion is configured so as to propagate the at least one superconducting element from each of the sidewalls of the gate at least to the centre of the gate, such that the superconducting region is formed across an entire width $L_g$ of the superconducting gate. The gate is thus entirely superconducting. This improves the control of the quantum device thus formed.

According to one example, the gate has a width $L_g \leq 20$ nm and the metal layer formed has a thickness $e_m \geq L_g/5$. This ensures that there is a sufficient amount of superconducting elements in the metal layer, such that the entire gate can be made superconducting as a result of the lateral diffusion.

According to one example, the metal layer is formed by conformal deposition of metal on the transistor pattern and on the front face of the substrate. This then allows, typically by homogenising annealing, superconducting source and drain regions to be formed in an active layer of the substrate at the same time as the superconducting region is formed in the gate.

According to one example, the metal layer is formed by conformal deposition of metal on the transistor pattern and on the dielectric layer. This prevents diffusion of at least one superconducting element into an active layer of the substrate. This allows the source and drain regions to be formed or silicided at a later time. The formation of raised source/drain regions can thus be envisaged.

According to one example, lateral diffusion is achieved by thermal annealing, for example by RCA (Rapid Thermal Annealing).

The conditions for lateral diffusion or lateral silicidation can in particular depend on the metal used and the target phase. The table below gives examples of thickness ratios between different metals (Co, Pt and V) and silicon. The annealing environment can be in an Ar, He or $N_2$ inert gas.

| Metal (nm) | Silicon (nm) | Silicide formed (nm) | T° C. range Advantageous range | Time range Advantageous range | Annealed in Ar, He |
|---|---|---|---|---|---|
| Pt 1.00 | Si 1.35 | PtSi 1.98 | 400° C. to 700° C. 450° C. to 550° C. | 10 s to 300 s 60 s to 120 s | A single RTA-type anneal |
| 2 Co 1.00 | Si 0.91 | $Co_2Si$ 1.47 | 550° C. to 900° C. 600° C. to 800° C. | 10 s to 300 s 60 s to 120 s | 2 RTA-type annealing steps |
| V 1.00 | Si 0.48 | V3Si 1.26 | 600° C. to 1000° C. 750° C. to 850° C. | 10 s to 1000 s 60 s to 500 s | A single RTA-type anneal |

According to one example, the substrate carries a plurality of transistor patterns.

According to one example, a subset of the plurality of transistor patterns is masked prior to the formation of the metal layer so as to prevent the formation of superconducting regions in the gates of the transistor patterns of said subset. This allows quantum devices to be co-integrated with transistors, for example FDSOI CMOS transistors, on the same substrate.

Unless specifically indicated otherwise, technical features described in detail for a given embodiment can be combined with the technical features described within the context of other embodiments described by way of example and in a non-limiting manner. In particular, the elements described or shown in the figures for the device or for the method can be combined to form another embodiment which is not necessarily illustrated or described. It goes without saying that such an embodiment is not excluded from the scope of the invention.

It is specified that, within the scope of the present invention, the terms "on", "overlying", "covers", "beneath" or "underlying" or the equivalents thereof do not necessarily mean "in contact with". Thus, for example, a hard mask on a gate does not necessarily mean that the hard mask and the gate are directly in contact with one another, but rather means that the hard mask covers at least partially the gate while being either directly in contact therewith, or while being separated therefrom by at least one other layer or at least one other element.

Moreover, a layer can be constituted by a plurality of sub-layers made of the same material or made of different materials.

A substrate, layer, or device "based on" a material M is understood to mean a substrate, a layer, or a device comprising this material M only or comprising this material M and optionally other materials, for example alloying elements, impurities or doping elements. Thus, a spacer or a dielectric portion based on silicon nitride SiN can, for example, comprise non-stoichiometric silicon nitride (SiN) or stoichiometric silicon nitride (Si3N4), or even a silicon oxynitride (SiON).

Typically, but in a non-limiting manner, a spacer forms a ring around the gate, with a closed contour; the dielectric portion according to the present invention can typically correspond to such a spacer. The description of the dielectric portion preferably refers to a single dielectric portion around the gate; however, illustrative sectional drawings, generally viewed along a plane parallel to the longitudinal direction of the channel, show two spacer or dielectric portion parts on either side of the sidewalls of the gate. By extension, these two spacer or dielectric portion parts can be referred to in this case as "the spacers" or "the dielectric portions". Furthermore, the invention relates to embodiments wherein at least two discontinuous spacers or two discontinuous dielectric portions flank a basal gate portion.

The present invention in particular allows at least one quantum device or a plurality of quantum devices to be manufactured on a substrate. This substrate can be a "bulk" substrate, or even of the semiconductor on insulator type, for example a silicon on insulator (SOI) substrate or a germanium on insulator (GeOI) substrate. This substrate has a "front face" on which the transistor pattern of the quantum device is located. This front face is thus not necessarily exposed.

The invention can also be implemented more widely for various microelectronic devices or components.

A microelectronic component, device or device element is understood to mean any type of element made using microelectronic means. In addition to devices intended for purely electronic purposes, these devices in particular include micromechanical or electromechanical devices (MEMS, NEMS, etc.) as well as optical or optoelectronic devices (MOEMS, etc.).

Several embodiments of the invention implementing successive steps of the manufacturing method are described hereinbelow. Unless specified otherwise, the adjective "successive" does not necessarily imply that the steps immediately follow on from one another, although this is generally preferred, and they can be separated by intermediate steps. Moreover, the term "step" is understood to mean the performance of a part of the method, and can denote a set of sub-steps.

In the present application, a figure can illustrate a plurality of steps or sub-steps.

The term "dielectric" qualifies a material whose electric conductivity is low enough in the given application to act as an insulator. In the present invention, a dielectric material preferably has a dielectric constant of less than 7. The spacers are typically made of a dielectric material.

The terms "gate pattern", "gate stack" and "gate" are used synonymously.

"Etching selectively to" or "etching with selectivity to" are understood to mean an etch that is configured so as to remove a material A or a layer A from a material B or from a layer B, and having an etch rate of the material A that is greater than the etch rate of the material B. Selectivity is the ratio of the etch rate of the material A to the etch rate of the material B.

The present patent application preferentially employs the term thickness for a layer, height for a device (for example a gate) and depth for a cavity or an etch. The thickness is considered in a direction normal to the main plane of extension of the layer, the height and the depth are considered in a direction normal to the base plane of the substrate. The main extension plane of the layer, respectively the base plane of the substrate, is generally parallel to a bottom face or top face of this layer, respectively of this substrate.

In the present patent application, a preferably orthonormal coordinate system formed by the axes x, y, z is shown in the accompanying drawings. The substrate, more specifically the bottom face and/or the top face thereof, extends in the basal plane xy.

In the description hereafter, the height and depth are considered in the direction shown by the z-axis, and the width is considered in the direction shown by the x-axis.

An element located "vertical to" or "in line with" or "in the continuation of" another element means that these two elements are both located on the same line perpendicular to the basal plane, i.e. on the same line oriented along the z-axis in the figures.

"Horizontal" is understood to mean an orientation parallel to a plane xy. "Vertical" is understood to mean an orientation parallel to the z-axis.

The terms "substantially", "about", and "in the order of" mean "to within 10%" or, when referring to an angular orientation, "to within 10°". Thus, a direction substantially normal to a plane means a direction having an angle of 90±10° relative to the plane.

The invention will now be described in detail by way of several non-limiting embodiments.

Figure 3A:
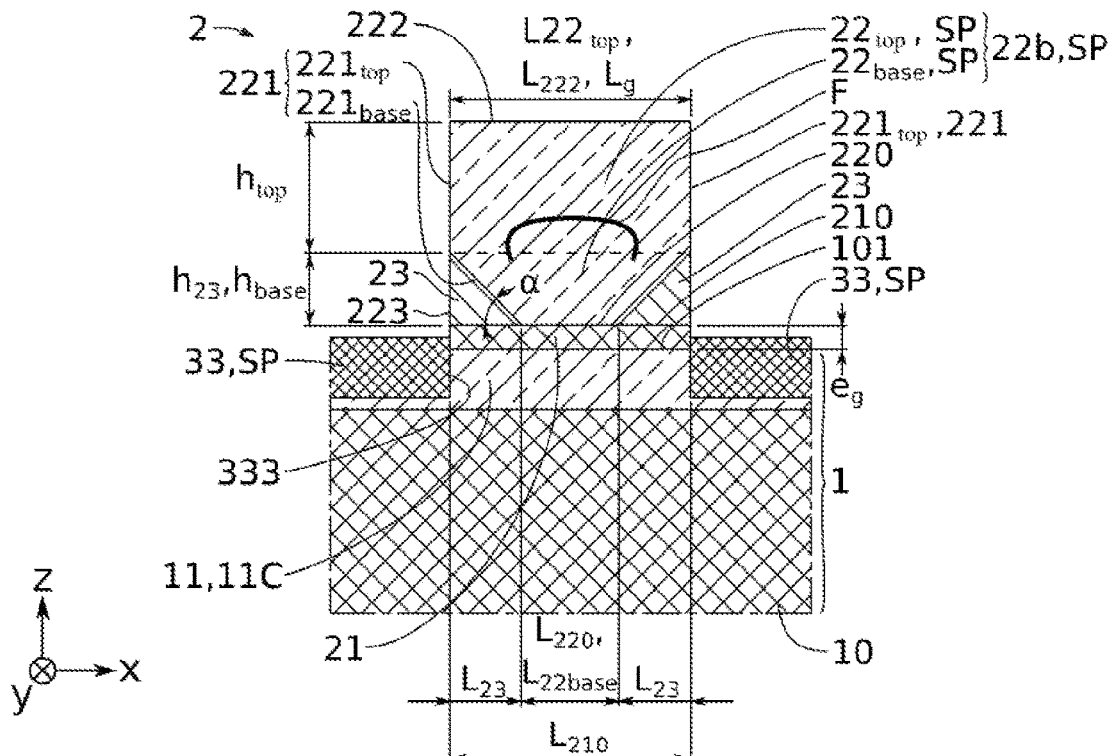
FIG. 3A diagrammatically shows a quantum device according to a first embodiment of the present invention.
Figure 3B:
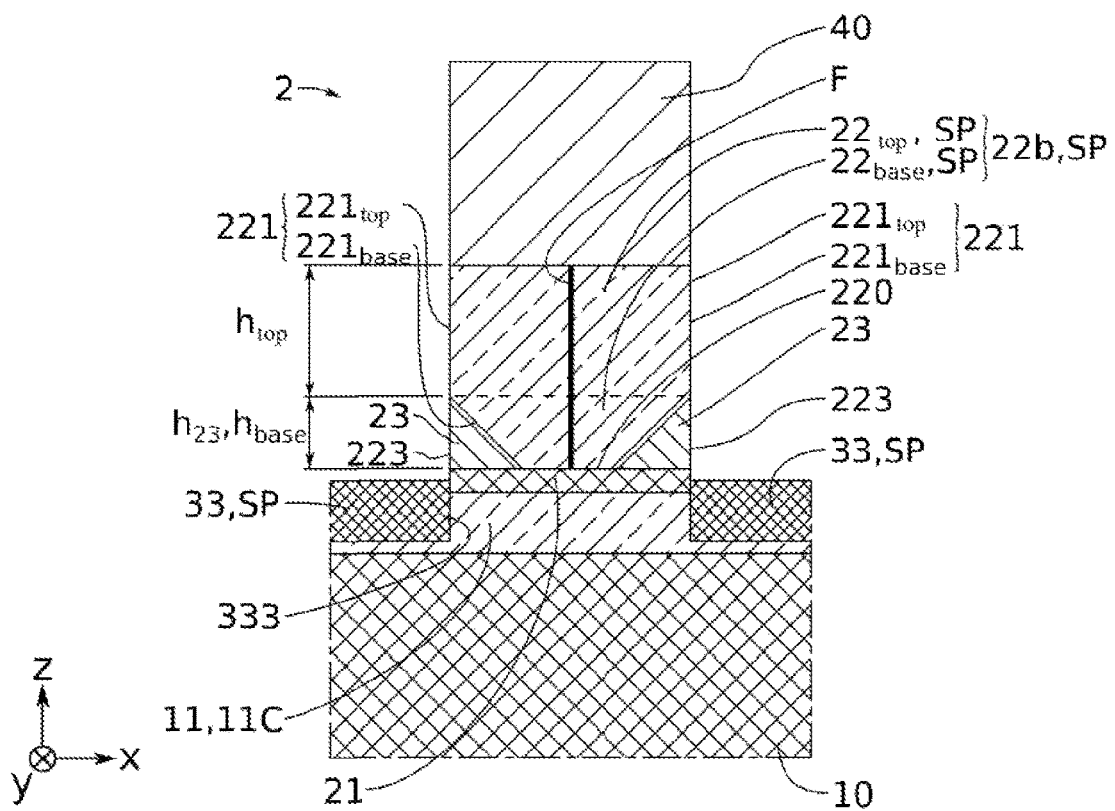
FIG. 3B diagrammatically shows a quantum device according to a second embodiment of the present invention.
Figure 4:
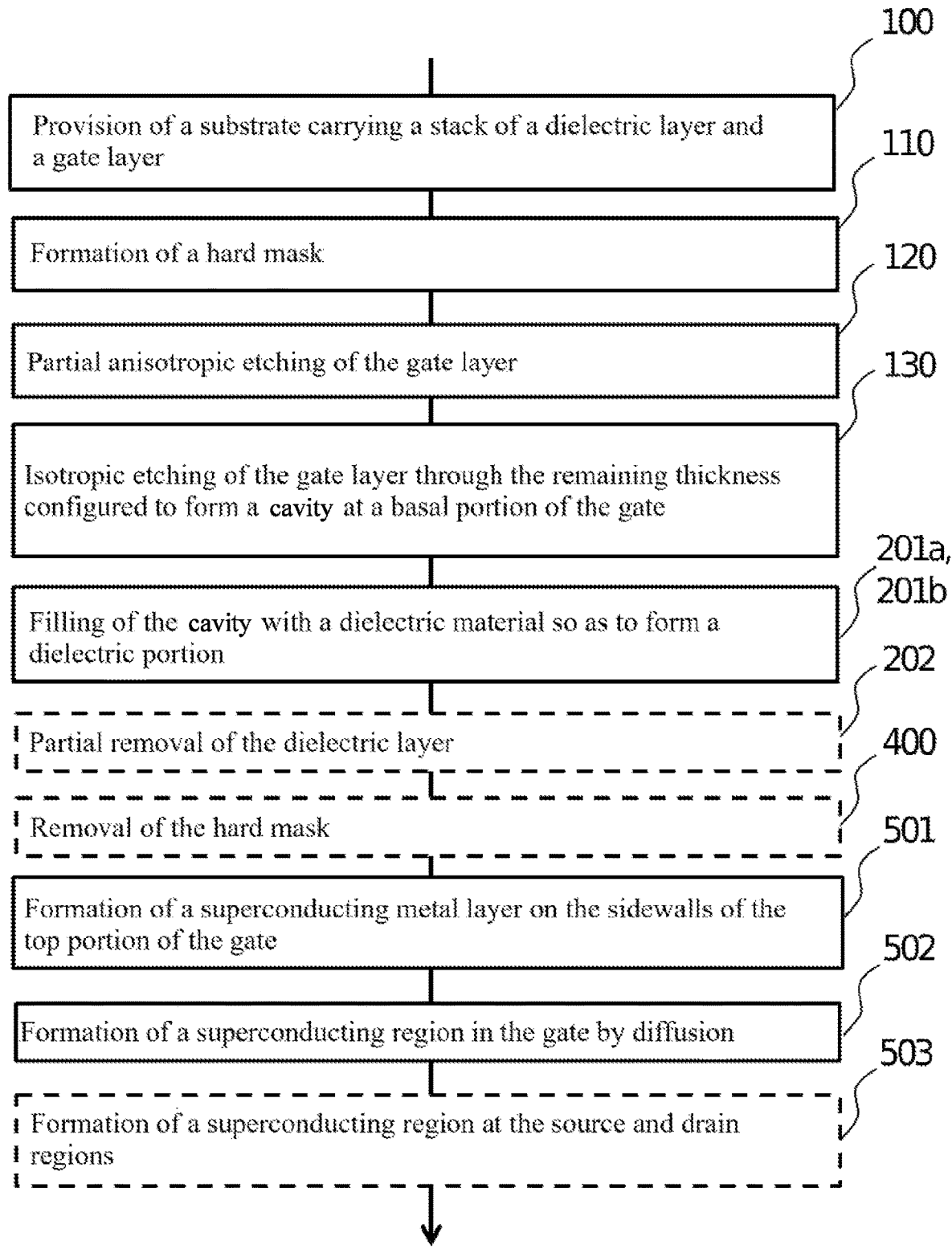
FIG. 4 shows a diagram illustrating the steps involved in producing a quantum device according to one embodiment of the method according to the present invention.

A first embodiment of the device is shown in FIG. 3A. A second embodiment of the device is shown in FIG. 3B. These two embodiments differ essentially through the presence of a hard mask 40 and potentially through the shape of the silicidation front F within the superconducting gate 22b. The hard mask 40 is in particular useful for the manufacture of the device. It is not intended to be retained during use of the device. It can be removed at the end of the method for producing the device. The other features described hereafter are common to both of these embodiments.

As shown in FIG. 3A, 3B, the device typically comprises a transistor pattern 2 comprising a gate dielectric 21 overlaid by a superconducting gate 22b. This transistor pattern 2 is carried by a substrate 1. The substrate 1 is typically an SOI substrate in this case, comprising an active layer 11 on a buried oxide 10. The gate dielectric 21 typically has, as a main component, silicon dioxide SiO2, or a material with a high dielectric constant. The gate dielectric 21 typically has a thickness $e_g$ comprised between 1 nm and 5 nm. It has a top face 210, opposite a contact face in contact with the front face 101 of the substrate 1. The top face 210 is in direct contact with the gate 22b.

The superconducting gate 22b comprises a superconducting region SP based on a silicide of a superconducting metal, for example SiCo2, SiPt, SiV3. This superconducting region SP preferably extends throughout the volume of the gate 22b, such that the gate 22b is entirely superconducting. The gate 22b has two portions $22_{top}$, $22_{base}$, referred to as the top portion $22_{top}$ and the basal portion $22_{base}$ located one above the other. The sidewalls 221 of the gate 22b have two sidewall portions $221_{top}$, $221_{base}$, respectively corresponding to the top portion $22_{top}$ and basal portion $22_{base}$.

The top portion $22_{top}$ typically has a dimension $L_{22top}$ along x that is about constant, and preferably equal to the dimension $L_{222}$ of the top 222. This dimension $L_{22top}$ is less than 25 nm and preferably less than 20 nm. The top portion $22_{top}$ has a height $h_{top}$ comprised between about 15 nm and 200 nm.

The basal portion $22_{base}$ is narrower than the top portion $22_{top}$, along x. It has a dimension $L_{22base}$ that is smaller than the dimension $L_{22top}$ of the top portion $22_{top}$. The basal portion $22_{base}$ extends to the base 220 and in particular has a dimension $L_{220}$ at the base 220 that is at least 20% smaller than the dimension $L_{22top}$ of the top portion $22_{top}$. This dimension $L_{220}$ is typically at least 20% smaller than the dimension $L_{210}$ of the top face 210 of the gate dielectric 21. The base 220 of the basal portion $22_{base}$ does not completely cover the top face 210 of the gate dielectric 21. In particular, the base 220 of the basal portion $22_{base}$ does not extend to the edge of the gate dielectric 21 along x. The basal portion $22_{base}$ can have a frustoconical shape as shown in FIG. 3A, 3B. It can have a regularly decreasing width along x between the top portion $22_{top}$ and the base 220. Alternatively, it can have different shapes and/or different changes in width between the top portion $22_{top}$ and the base 220. The shape of the basal portion $22_{base}$ is typically generated by etching a more solid layer in which cavities are formed, as described hereafter. Thus, the shape of the basal portion $22_{base}$ depends on how the cavities develop. Preferential etching along certain crystallographic planes or along certain grain boundaries (for example in the case of polycrystalline silicon) can, for example, lead to the formation of sidewalls $221_{base}$ that are inclined at an angle α to the top face 210 or to the basal plane xy. This angle α can be comprised between 30° and 60°, for example about 45°. The sidewalls $221_{base}$ are not necessarily planar. The basal portion $22_{base}$ has a height $h_{base}$ comprised between 2 nm and 20 nm.

The width $L_g$ of the gate 22b is typically equal to $L_{22top}$. The height $h_g$ of the gate 22b is typically equal to $h_{top}+h_{base}$.

The device further comprises dielectric portions 23, also referred to as spacers. These spacers 23 typically fill the aforementioned cavities. They are made of a dielectric material, that for example has, as a main component, silicon oxide SiO2, silicon nitride SiN, or another material with a low dielectric constant known as a "low-k" material. They can optionally be formed by a combination of these different materials, for example in the form of multilayers. The spacers 23 are in contact with the sidewalls $221_{base}$ and the top face 210 of the gate dielectric 21. They can have substantially vertical sidewalls 223, in the continuation of the sidewalls $221_{top}$ of the top portion $22_{top}$. The spacers 23 have a dimension $L_{23}$ along x that is, for example, comprised between 2 nm and 5 nm.

The device can further comprise superconducting source and drain regions 33 SP. These superconducting source and drain regions 33 can be formed in or from the active layer 11. Advantageously, they can have, as a main component, the same superconducting metal silicide as the gate 22b. The superconducting source and drain regions 33 preferably extend along the x-axis until vertical to the sidewalls 23 and/or the sidewalls $221_{top}$. In particular, the superconducting source and drain regions 33 can have one or more substantially vertical edges 333, in the continuation of the sidewalls 23 and/or the sidewalls $221_{top}$. This reduces the distance of the source and drain regions 33 from the channel 11c beneath the transistor pattern 2. The channel 11c access resistance is thus reduced.

In the first embodiment of the device shown in FIG. 3A, the silicidation front F can be in part substantially parallel to the top 222. This typically indicates that the superconducting region SP has been formed by diffusion from the top 222.

In the second embodiment of the device shown in FIG. 3B, the transistor pattern 2 is overlaid by a hard mask 40 typically based on silicon nitride SiN or SiO2. In this embodiment, the silicidation front F can be substantially vertical. This typically indicates that the superconducting region SP has been formed by lateral diffusion from the sidewalls $221_{top}$.

FIG. 4 and FIG. 5A to 5I show embodiments of the method according to the invention. These embodiments of the method in particular allow the devices described hereinabove, according to the first and second embodiments, to be obtained.

Figure 5A:
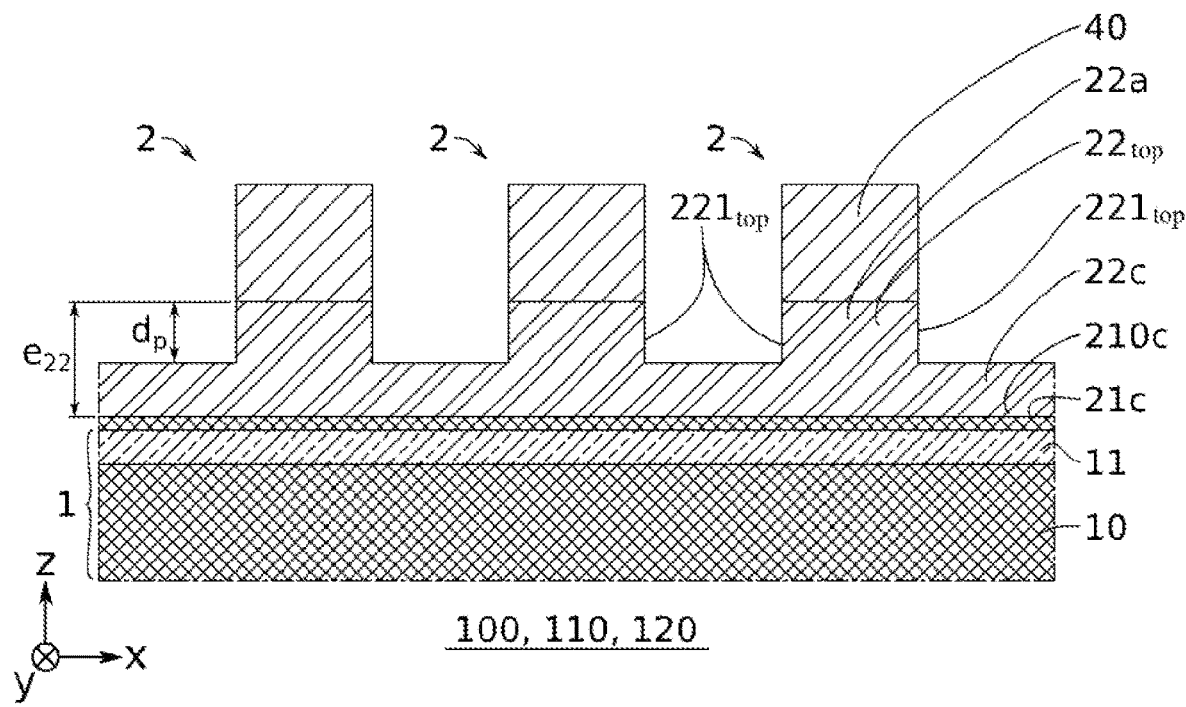
FIGS. 5A to 5D diagrammatically show the steps involved in forming a quantum device according to a first embodiment of the method according to the present invention.

As shown in FIG. 5A, a substrate 1 carrying a stack of a dielectric layer 21c and a gate layer 22c is previously provided 100. The dielectric layer 21c can be formed by oxidation or deposition on the front face 101 of the substrate 1, typically on the active layer 11 of an SOI-type substrate 1. The gate layer 22c can be formed by deposition on the top face 210c of the dielectric layer 21c. The gate layer 22c initially has a thickness $e_{22}$, for example comprised between 20 nm and 200 nm. The gate layer 22c preferably has, as a main component, a single semiconductor material. It typically has, as a main component, polycrystalline silicon (polySi).

One or more hard masks 40 are formed 110 on this gate layer 22c so as to define transistor patterns 2. The hard masks 40 can be formed 110 in a known manner by lithography/etching.

The gate layer 22c is then partially etched 120 by a first etch to a depth $d_p$ that is, for example, comprised between about 15 nm and 195 nm. The depth $d_p$ corresponds substantially to the height $h_{top}$ of the top portion $22_{top}$ of the polySi gate 22a. This first partial etching is anisotropic, directed along z. This can be carried out by conventional plasma etching, for example using a HBr/O2 plasma. Alternatively, this first etch can be carried out by a fluorocarbon or chlorine-based plasma, followed by an oxygen plasma to oxidise the sidewalls of the gate. The first etch forms the sidewalls $221_{top}$ of the top portion $22_{top}$ of the polySi gate 22a. The sidewalls $221_{top}$ of the top portion $22_{top}$ are typically oxidised after this first etch. The exposed surfaces of the gate layer 22c are typically oxidised after this first etch.

Figure 5B:
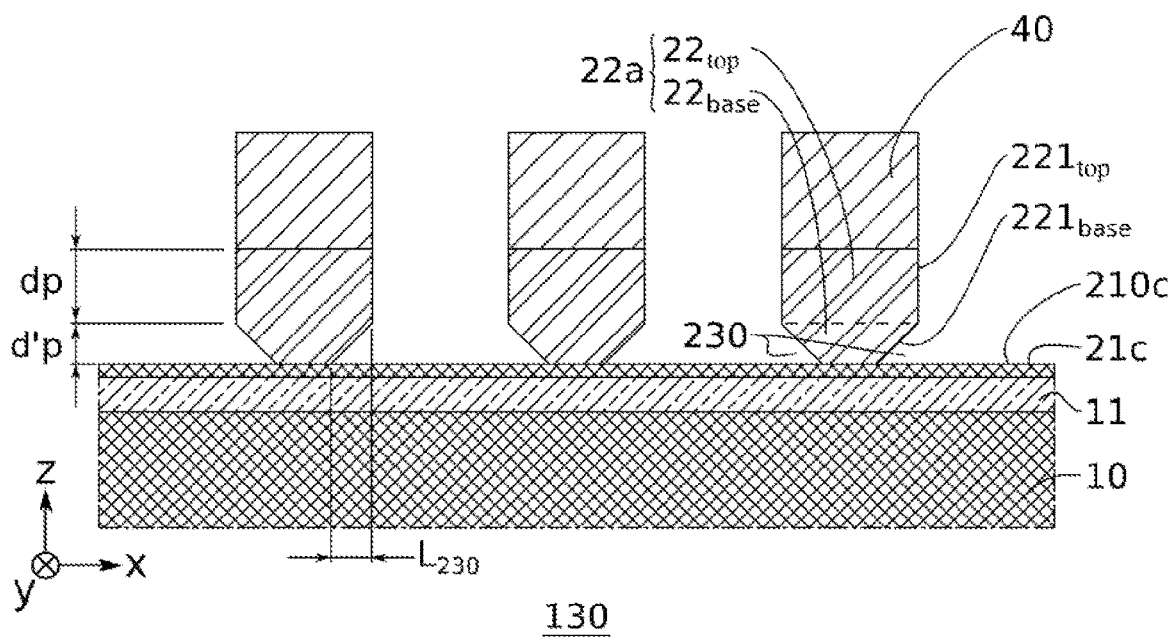

As shown in FIG. 5B, the gate layer 22c is then etched 130 isotropically by a second etch through the remaining thickness $d'_p$. This second etch is configured to form one or more cavities 230 defining the basal portion $22_{base}$ of the poly Si gate 22a. This second etch can comprise prior deoxidation of the exposed horizontal surfaces of the gate layer 22c. This deoxidation can be carried out using an Argon- or CF4-based plasma. The isotropic etching of the gate layer 22c can then be carried out by an SF6-based plasma, which is selective to the oxide. This fluorine-based chemistry advantageously allows the gate layer 22c to be etched in an isotropic manner, without etching the oxidised sidewalls $221_{top}$. According to another possibility, this chemistry can have, as a main component, a mixture of fluorocarbon and SF6. The concentration of fluorocarbon can be gradually reduced during the etching of the gate layer 22c. This allows for passivation of the sidewalls $221_{base}$ (beneath the top portion $22_{top}$) and for this passivation to be reduced progressively with the etching. This typically results in an inclined profile for the sidewalls $221_{base}$. The cavities 230 formed as a result of this second etch extend over a width $L_{230}$ along x that is typically comprised between 2 nm and 5 nm. This second etch forms the sidewalls $221_{base}$ of the top portion $22_{base}$ of the poly Si gate 22a. The top face 210c of the dielectric layer 21c is typically exposed after this second etch.

Figure 5C:
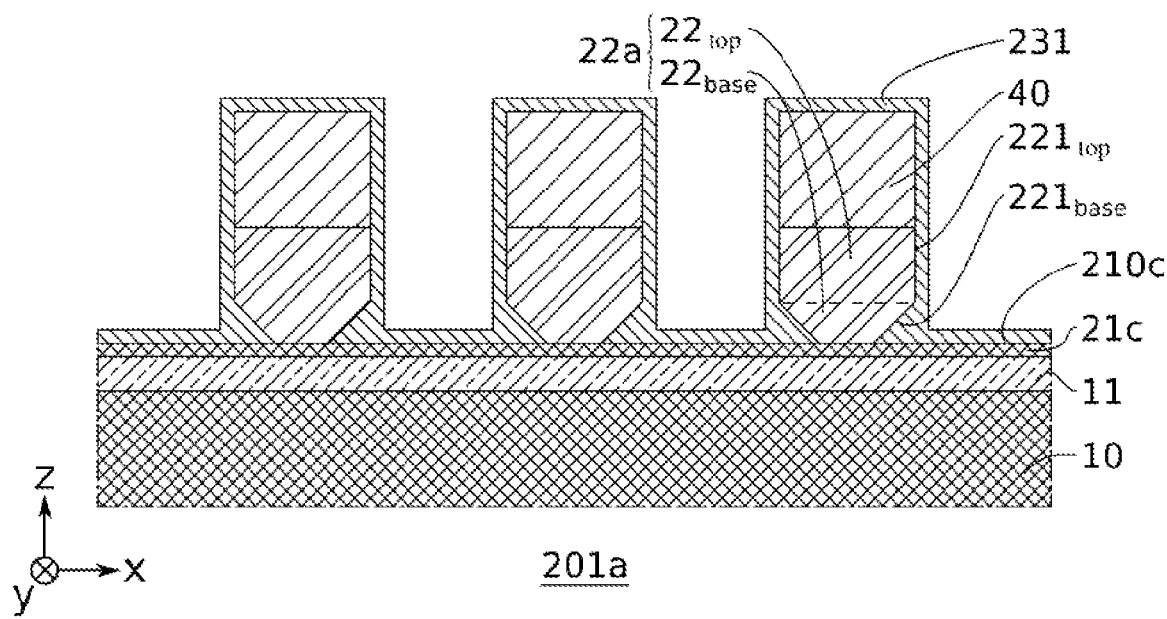

As shown in FIG. 5C, a layer 231 is then deposited so as to fill 201a the cavities 230. This layer 231 is made of a spacer material, that for example has, as a main component, silicon oxide SiO2, silicon nitride SiN, or another material with a low dielectric constant known as a "low-k" material. According to one possibility, the layer 231 can comprise a plurality of sublayers forming a multilayer of spacer materials. It is typically deposited conformally, to a thickness that is sufficient to fill the cavities 230.

Figure 5D:
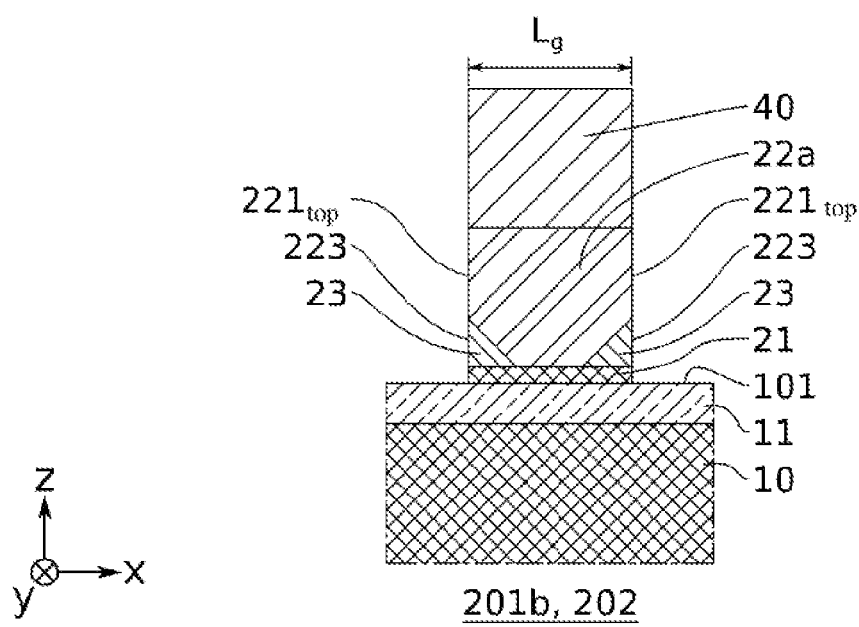

As shown in FIG. 5D, the layer 231 is then etched, typically anisotropically along z, so as to form 201b the dielectric portions or spacers 23. After this etching, the spacers 23 typically have substantially vertical sidewalls 223, in the continuation of the sidewalls $221_{top}$ of the top portion $22_{top}$ of the poly Si gate 22a.

The dielectric layer 21c is also anisotropically etched 202 along z. This forms the gate dielectric 21 beneath the hard mask 40 and the gate 22a of width $L_g$. The front face 101 of the substrate 1 is exposed after this etching.

Figure 5E:
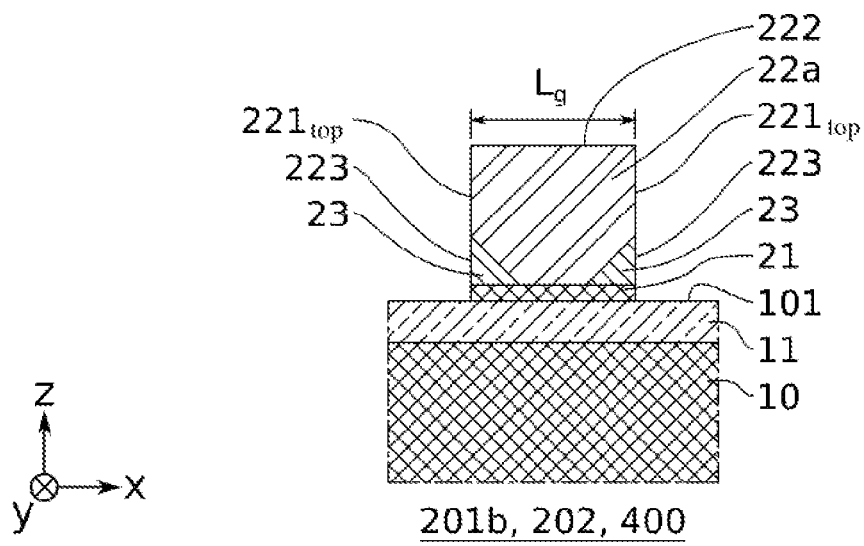
FIG. 5E diagrammatically shows the steps involved in forming a quantum device according to a second embodiment of the method according to the present invention.

FIG. 5E shows an alternative embodiment of the method for obtaining the device according to the first embodiment described hereinabove. According to this alternative embodiment, the hard mask 40 is removed 400 so as to expose the top 222 of the gate 22a.

The sidewalls $221_{top}$ of the gate 22a, respectively the sidewalls $221_{top}$ and the top 222 of the gate 22a, are exposed after the layer 231 has been etched, respectively after the layer 231 has been etched and the hard mask 40 has been removed.

Figure 5F:
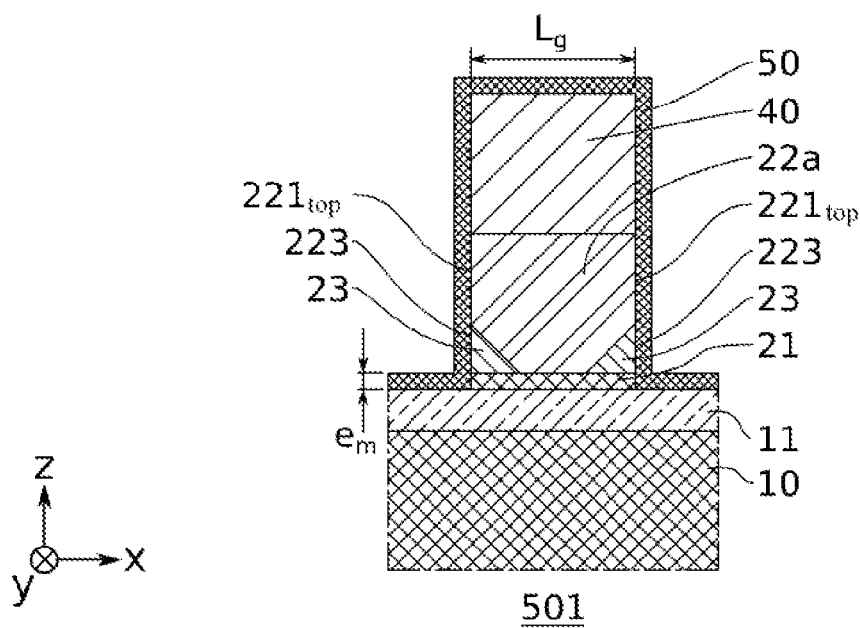
FIG. 5F diagrammatically shows a step of forming a quantum device according to a first embodiment of the method according to the present invention.
Figure 5G:
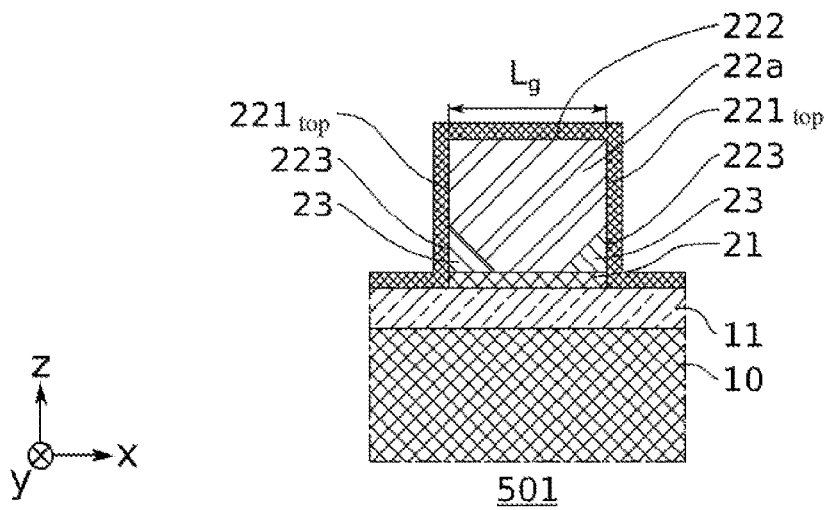
FIG. 5G diagrammatically shows a step of forming a quantum device according to a second embodiment of the method according to the present invention.

FIG. 5F, 5G show the formation 501 of a superconducting metal layer 50 on the two alternative embodiments of the device shown in FIG. 5D, 5E.

Prior to the deposition of the metal layer 50, the sidewalls $221_{top}$ and, where appropriate, the top 222 can be cleaned, for example by argon or helium plasma. The metal layer 50 can be conformally deposited on the transistor patterns 2, with or without a hard mask 40, and on the active layer 11. The metal layer 50 covers at least the sidewalls $221_{top}$. This metal layer 50 comprises at least one superconducting element, for example chosen from cobalt, platinum or vanadium. It has a thickness $e_m$. This thickness $e_m$ is preferably chosen such that the entire gate 22a is transformed into a superconducting region after the subsequent diffusion step. In particular, for a polySi gate 22a, the superconducting silicide formed from the lateral diffusion into the gate 22a of the superconducting elements of the metal layer 50, for example cobalt silicide CoSi2, platinum silicide PtSi, vanadium silicide V3Si, has a width $L_{super}$ that is proportional to the width $L_{Si}$ of polySi consumed during the transformation, such that $L_{super}=\alpha.L_{Si}$, where $1.5 \leq \alpha \leq 2.5$. Since diffusion takes place from each of the sidewalls $221_{top}$ of the gate 22a, the width $L_{super}$ required to transform the gate 22a into the superconducting region SP is equal to $L_g/2$. Thus, a thickness $e_m$ of metal layer 50 greater than or equal to the width $L_{Si}$ of polySi consumed during the transformation allows the gate 22a to be silicided over the entire width $L_g$ thereof. It is thus preferable to choose $e_m \geq L_g/2\alpha$, i.e. $e_m \geq L_g/5$.

Figure 5H:
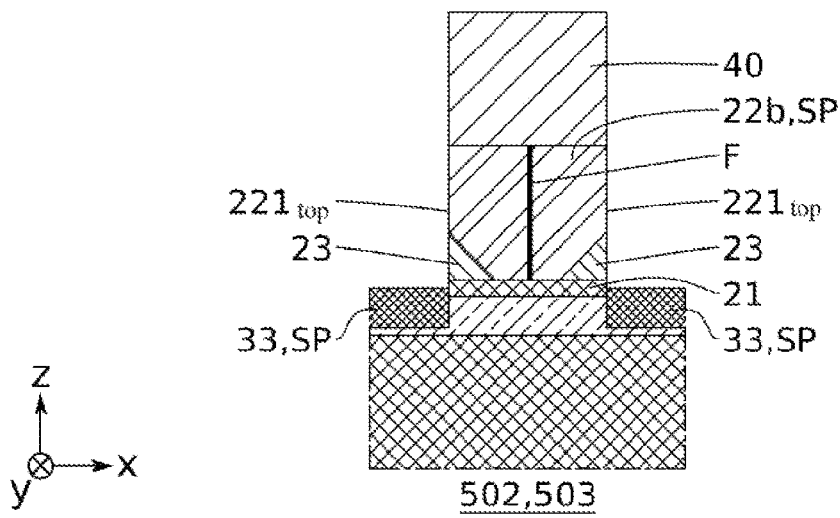
FIG. 5H diagrammatically shows the steps involved in forming a quantum device according to a first embodiment of the method according to the present invention.
Figure 5I:
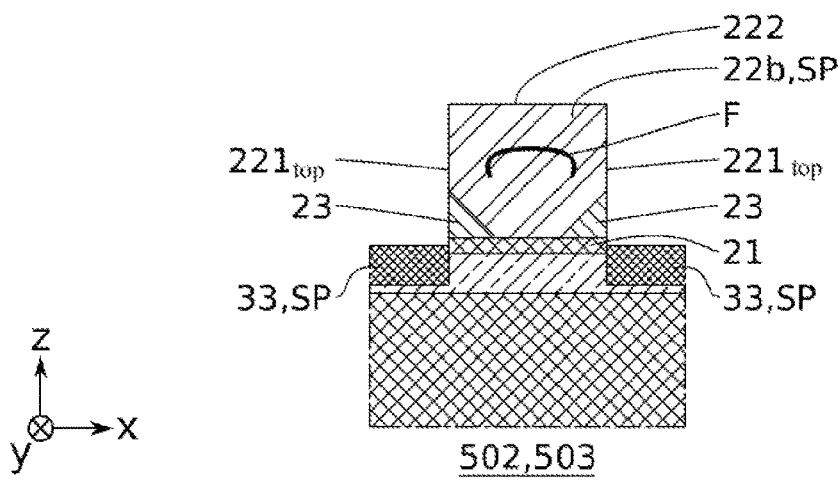
FIG. 5I diagrammatically shows the steps involved in forming a quantum device according to a second embodiment of the method according to the present invention.

FIG. 5H, 5I show the formation 502, 503 of superconducting regions SP within the gate 22a and within the active layer 11, in the two alternative embodiments of the device shown in FIG. 5F, 5G.

The superconducting region SP is formed 501 within the gate 22a at least in part by lateral diffusion of the superconducting elements from the sidewalls $221_{top}$, i.e. mainly along x. This lateral diffusion is preferably configured such that the superconducting region SP is formed over the entire width $L_g$ of the gate 22a, and over the entire height $h_g$ of the gate 22a. The gate 22a thus becomes a superconducting gate 22b.

In the case shown in FIG. 5H, diffusion only takes place laterally, and two diffusion fronts develop from the two sidewalls $221_{top}$ of the gate 22a. These diffusion fronts, referred to as lateral fronts, are substantially vertical and progress towards the median plane yz of the gate 22a. The gate 22a is completely transformed into a superconducting gate 22b when the fronts meet at this median plane yz. The presence of the hard mask 40 in this case prevents diffusion of the superconducting elements from the top of the gate 22a. The silicidation front F, which corresponds to the junction between the diffusion fronts, lies substantially in the median plane yz. This results in a superconducting gate 22b with good crystal quality.

In the case shown in FIG. 5I, diffusion takes place from the sidewalls $221_{top}$ and from the top 222 of the gate 22a. A third diffusion front, referred to as the top front, develops from the top 222. The silicidation front F, which corresponds to the junction between the lateral and top diffusion fronts, has a more complex profile than the case shown in FIG. 5H. At an intermediate stage of silicidation, this silicidation front F can have an inverted U-profile. At the end of silicidation, the silicidation front F typically has an I-shaped profile similar to that shown in FIG. 5H, but with smaller dimensions, typically shorter dimensions. This variant allows a superconducting gate 22b to be obtained more quickly.

According to one advantageous possibility, superconducting regions SP are also formed 503 by diffusion within the active layer 11 during the formation 501 of the superconducting region SP within the gate 22a. These superconducting regions SP thus become superconducting source and drain regions 33. The diffusion of the superconducting elements in this case takes place from the front face 101 of the substrate 1.

Diffusion of the superconducting elements within the gate 22a and/or within the active layer 11 is typically achieved by thermal annealing, for example by RCA-type annealing.

The conditions for lateral diffusion or lateral silicidation can in particular depend on the metal used and the target phase. The table below gives examples of thickness ratios between different metals (Co, Pt and V) and silicon. The annealing environment can be in an Ar, He or $N_2$ inert gas.

| Metal (nm) | Silicon (nm) | Silicide formed (nm) | T° C. range Advantageous range | Time range Advantageous range | Annealed in Ar, He |
|---|---|---|---|---|---|
| Pt | Si | PtSi | 400° C. to 700° C. | 10 s to 300 s | A single RTA-type anneal |
| 1.00 | 1.35 | 1.98 | 450° C. to 550° C. | 60 s to 120 s | |
| 2 Co | Si | Co$_2$Si | 550° C. to 900° C. | 10 s to 300 s | 2 RTA-type annealing steps |
| 1.00 | 0.91 | 1.47 | 600° C. to 800° C. | 60 s to 120 s | |
| V | Si | V3Si | 600° C. to 1000° C. | 10 s to 1000 s | A single RTA-type anneal |
| 1.00 | 0.48 | 1.26 | 750° C. to 850° C. | 60 s to 500 s | |

After formation 502, 503 of the superconducting regions SP, the metal residues are preferably cleaned, for example with a hydrogen peroxide H2O2-based solution, such as Caro's acid ($H_2O_2$:$H_2SO_4$), or with aqua regia (HCl:HNO3) and/or with a so-called SC1 mixture ($H_2O$:$H_2O_2$:$NH_4OH$). Depending on the nature of the superconducting elements, intermediate cleaning of metal residues can be carried out during the formation 502, 503 of the superconducting regions SP. A plurality of thermal anneals, for example before and after intermediate cleaning, can thus be implemented in order to form 502, 503 the superconducting regions SP.

Other alternative embodiments of the method not shown can also be envisaged.

According to one possibility, the dielectric layer 21c is retained prior to the deposition 501 of the metal layer 50 and during the formation 502 of the superconducting gate 22b. This prevents superconducting elements from diffusing within the active layer 11. Thus, after removal of the dielectric layer 21c, conventional source and drain regions can be formed by standard silicidation.

According to another possibility, raised source/drain (RSD) regions 33 can be formed.

According to another possibility, conventional FDSOI MOSFETs and superconducting gate quantum devices can be co-integrated on the same substrate 1. This can be achieved by masking part of the transistor patterns 2 with a masking layer prior to the deposition 501 of the metal layer 50. The gates 22a of these masked transistor patterns 2 are thus preserved during the formation 502 of the superconducting gates 22b.

The invention is not limited to the aforementioned embodiments, and includes all embodiments compliant with the general concept thereof.

The invention claimed is:

1. A quantum device comprising a transistor pattern carried by a substrate, the transistor pattern comprising, in a stack stacked in a stacking direction:
   a gate dielectric on a front face of the substrate, and
   a superconducting gate on a top face of the gate dielectric, the superconducting gate having a base face in contact with the top face of the gate dielectric, a top face opposite the base face and sidewalls extending between the base face and the top face of the superconducting gate, the superconducting gate comprising at least one superconducting region made of a metal material based on at least one superconducting element, the superconducting gate having a diffusion front of the at least one superconducting element oriented in the stacking direction, wherein
   the superconducting gate comprises a basal portion and a top portion, the basal portion extending in the stacking direction from the base face to the top portion and the top portion extending in the stacking direction from the basal portion to the top face of the superconducting gate, the basal portion having a first dimension, taken in a first direction of a basal plane parallel to the base face, the first dimension being smaller than a second dimension of the top portion, taken in the first direction, and the first dimension being smaller than a third dimension of the top face of the gate dielectric, taken in the first direction,
   the basal portion is recessed with respect to the top portion and to the gate dielectric in the first direction, the recess forming at least one cavity, and
   the transistor pattern further comprises a dielectric portion made of a dielectric material in the at least one cavity.

2. The quantum device according to claim 1, wherein the first dimension of the base face is equal to a minimum dimension of the basal portion, the first and minimum dimensions being at least 20% smaller than the second dimension.

3. The quantum device according to claim 1, wherein a maximum dimension of the top portion and the third dimension of the top face of the gate dielectric are substantially equal to one another.

4. The quantum device according to claim 1, wherein the second and third dimensions are smaller than 20 nm.

5. The quantum device according to claim 1, wherein the dielectric portion is in contact with the top face of the gate dielectric and in contact with the basal portion of the superconducting gate.

6. The quantum device according to claim 1, wherein the sidewalls of the gate at the basal portion are inclined at an angle a comprised between 30° and 60° to the basal plane.

7. The quantum device according to claim 1, wherein the dielectric portion has at least one sidewall substantially of aligned with at least one of sidewalls of the superconducting gate.

8. The quantum device according to claim 1, wherein the base of the gate is substantially centred in the first direction relative to the top face of the gate dielectric in the first direction.

9. The quantum device according to claim 1, wherein the basal portion has a first height taken in a third direction normal to the basal plane, and the dielectric portion has a second height in the third direction that is substantially equal to the first height.

10. The quantum device according to claim 1, further comprising source and drain regions comprising at least one superconducting region made of a material based on at least one superconducting element and a channel formed between the source and drain regions and under the gate dielectric.

11. The quantum device according to claim 10, wherein the source and drain regions each have an edge that is aligned with at least one sidewall of the dielectric portion.

12. A method for producing a quantum device according to claim 1, comprising:
   providing the substrate having a front face and carrying, in a stack on the front face thereof:

a dielectric layer made of a dielectric material having a top face extending along a basal plane, and a gate layer made of a gate material on the top face of the dielectric layer, the gate layer having a thickness in a third direction normal to the basal plane, forming a hard mask on the gate layer, partially anisotropically etching, in the third direction and to a first depth less than the thickness in the third direction, the gate layer, so as to form gate sidewalls at the top portion of the gate, isotropically etching the gate layer to a second depth equal to the thickness minus the first depth, so as to expose the top face of the dielectric layer and so as to form at least one cavity at the basal portion of the gate located beneath the hard mask, in a projection along the third direction, the at least one cavity extending along a dimension in the first direction, filling the at least one cavity with a dielectric material so as to form at least one dielectric portion, forming a metal layer based on at least one metal species, at least on the sidewalls at the top portion of the gate, the at least one metal species comprising at least one superconducting element, and forming the at least one superconducting region in the gate by lateral diffusion of the at least one superconducting element from the sidewalls of said gate, so as to obtain the superconducting gate.

13. The method according to claim 12, wherein the hard mask is removed prior to forming the metal layer, the metal layer being formed on the sidewalls of the gate and the top of the gate, such that forming the superconducting region occurs by lateral diffusion from the sidewalls of the gate and by diffusion from the top of the gate.

14. The method according to claim 12, wherein the gate material is polycrystalline silicon and the metal layer formed comprises at least one superconducting element chosen from cobalt, platinum and vanadium.

15. The method according to claim 12 comprising, after forming the at least one dielectric portion, partially removing the dielectric layer configured to expose part of the front face of the substrate and to retain a portion of the dielectric layer beneath the hard mask, in a projection along the third direction, the portion of the dielectric layer forming the gate dielectric.

16. The quantum device according to claim 9, wherein the first and second heights are between 1 nm and 10 nm.

17. The quantum device according to claim 10, wherein the at least one superconducting element comprises one of a group consisting of PtSi, $Co_2Si$, or $V_3Si$.

18. The quantum device according to claim 1, wherein the top portion has a substantially constant width in the first direction, and a height of the basal portion from the base face of the basal portion to a top of the basal portion in the stacking direction in which the gate dielectric, basal portion and top portion are stacked is smaller than a height of the top portion extending from a bottom of the top portion to the top face of the superconducting gate in the stacking direction.

19. The quantum device according to claim 18, wherein the height of the basal portion is between 1 and 10 nm and the height of the top portion is between 15 and 200 nm.

* * * * *